United States Patent [19]

Mitzlaff

[11] Patent Number: 5,444,418
[45] Date of Patent: Aug. 22, 1995

[54] METHOD AND APPARATUS FOR FEEDFORWARD POWER AMPLIFYING

[75] Inventor: James E. Mitzlaff, Arlington Heights, Ill.

[73] Assignee: Motorola, Inc., Schaumburg, Ill.

[21] Appl. No.: 282,298

[22] Filed: Jul. 29, 1994

[51] Int. Cl.⁶ ............................................. H03F 1/32
[52] U.S. Cl. ...................................... 330/52; 330/151
[58] Field of Search ........................ 330/2, 52, 149, 151

[56] References Cited

U.S. PATENT DOCUMENTS

| | | | |
|---|---|---|---|
| 4,394,624 | 7/1983 | Bauman | 330/151 |
| 4,517,521 | 5/1985 | Prechutti et al. | 330/2 |
| 5,077,532 | 12/1991 | Obermann et al. | |
| 5,130,663 | 7/1992 | Tattersall, Jr. | |
| 5,307,022 | 4/1994 | Tattersall, Jr. et al. | |

OTHER PUBLICATIONS

H. Seidel, "A Microwave Feed-Forward Experiment", The Bell System Technical Journal, Nov. 1971, vol. 50, No. 9, pp. 2879–2916.

Primary Examiner—James B. Mullins
Attorney, Agent, or Firm—Kevin A. Buford

[57] ABSTRACT

A feedforward distortion minimization circuit includes a first loop with an input splitter and first and second signal paths, each signal path having an amplifier. An output combiner couples the two signal paths and has an output signal path and an output dump load path. A first signal detector on the dump load path detects a dump load signal, and in response a gain and phase controller operates to adjust the gain and phase of a first signal on one of two signal paths to minimize the power delivered to the dump load. The feedforward circuit also includes embodiments in which both amplifiers operate at around the same power amplification level, and in which a second loop has an error amplifier for further distortion correction.

29 Claims, 6 Drawing Sheets

METHOD AND APPARATUS FOR FEEDFORWARD POWER AMPLIFYING

FIELD OF THE INVENTION

The present invention relates generally to power amplifiers and more particularly to power amplifier networks employing a feedforward loop to reduce the distortion generated by a power amplifier.

BACKGROUND OF THE INVENTION

RF power amplifiers are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear; a perfect replica of the input signal increased in amplitude appears at the amplifier output. In reality, however, all power amplifiers have a degree of non-linearity in their transfer characteristic. This non-linearity results in the distortion of the output signal so that it is no longer a perfect replica of the input. This distortion produces spurious signal components known as intermodulation products. Intermodulation products are undesirable because they cause interference, cross talk, and other deleterious effects on the performance of a system employing the amplifier. Accordingly, the prior art reflects various methods and devices designed to reduce the distortion produced during a power amplifier's operation. Two methods commonly suggested are predistortion and feedforward.

Predistortion utilizes an auxiliary distortion source that produces an auxiliary distortion signal similar to the distortion generated by the power amplifier. The auxiliary distortion signal is added to the power amplifier input in the correct gain and phase to promote cancellation of the distortion at the power amplifier's output. This method requires matching the distortion characteristics of two dissimilar sources and hence limits the amount of correction which can be obtained.

The feedforward method does not have this limitation because it separates out the distortion generated by a power amplifier and adds it back into the power amplifier's output with gain, phase and delay adjusted for maximum cancellation. The amount of distortion reduction available using feedforward is primarily limited by the accuracy of the gain and phase adjustments.

Figure 1:
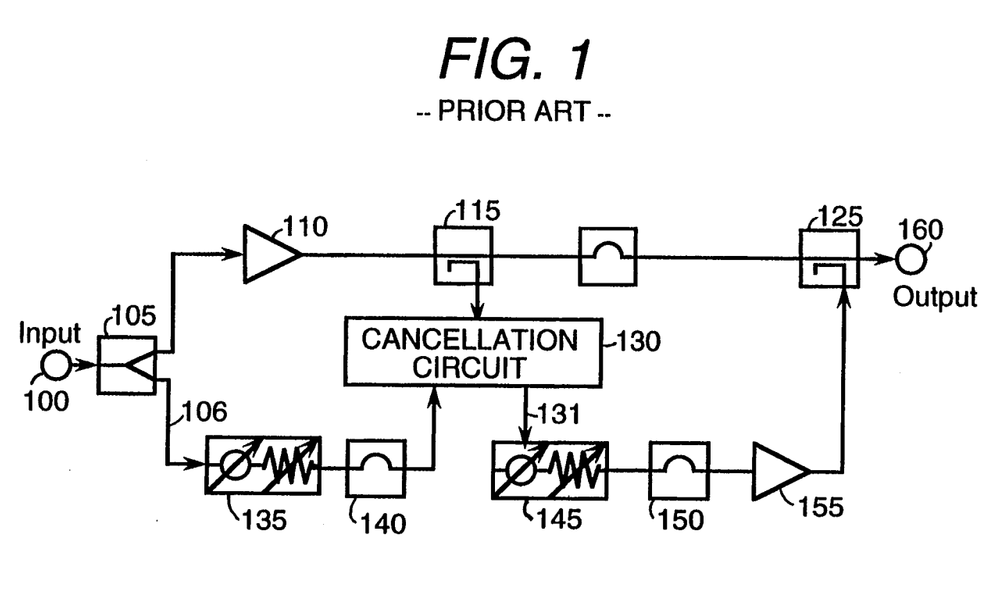
FIGS. 1 and 2 show feedforward amplifier networks according to the prior art.

Referring to FIG. 1, a prior art feedforward system is shown in block diagram form. Splitter circuit 105 divides the input signal 100: one part is sent to power amplifier 110 and the other to cancellation circuit 130 via path 106. The output from power amplifier 110 includes a distortion component caused by the amplification of the input signal 100. A portion of the output signal from the power amplifier 110 is taken from directional coupler 115 and sent to cancellation circuit 130. The gain, phase and delays, of the input signal on lead 106 is adjusted by fixed gain and phase 135 and delay 140 adjusters so that a portion of the input signal is canceled when combined with the signal from directional coupler 115, to derive a distortion component on lead 131. The distortion component is adjusted by fixed gain and phase 145 and delay 150 adjusters, so that when the distortion component is combined with the power amplifier output, at directional coupler 125, the resultant output signal 160 is free from distortion. The problem with this method, however, is the use of fixed gain, phase and delay adjusters which preclude the ability to adjust gain and phase parameters in response to operating point changes, such as, for example, input signal variations, voltage variations, and temperature fluctuations.

Figure 2:
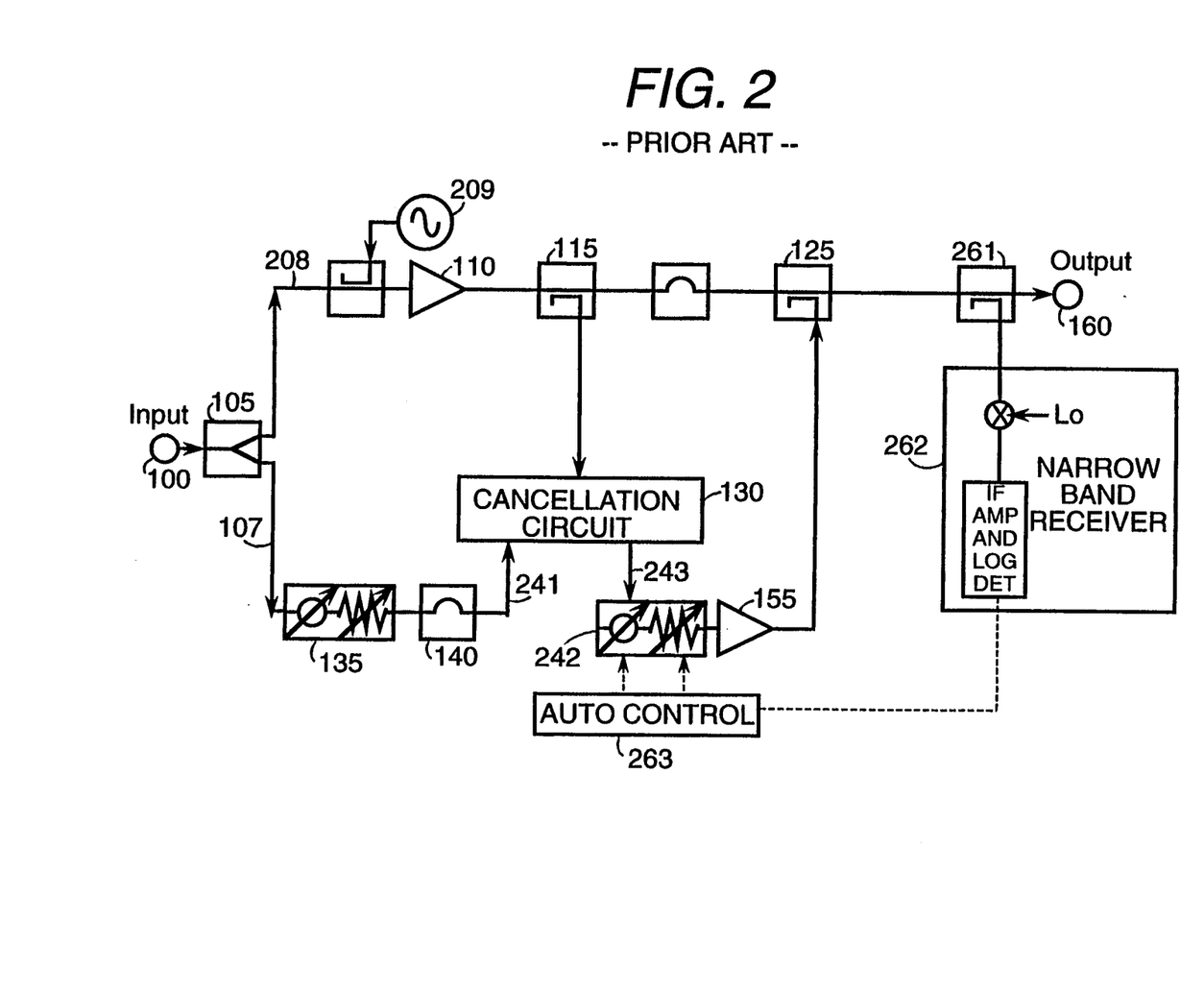

Referring to FIG. 2, there is shown yet another prior art feedforward system which attempts to overcome the above mentioned shortcomings. For convenience similar elements retain the same numbering as in FIG. 1. A test signal, or pilot 209, is injected, via coupler 208, into the main signal path of power amplifier 110. The magnitude of the pilot 209, when detected at the amplifier output by receiver 262 via coupler 261, is used by automatic control circuit 263 to adjust the gain and phase of signals on lead 242 in order to eliminate both the pilot and the distortion introduced by the power amplifier 110. The problem with this approach is that the injection of a single pilot tone fails to provide a wide-bandwidth solution to intermodulation product cancellation. In addition, the embodiment in FIG. 2 still teaches the use of fixed gain, phase and delay adjusters to provide carrier cancellation.

A further feedforward amplifier system is known from U.S. Pat. Nos. 5,077,532 to Obermann et al., and 5,130,663 to Tattersall, Jr., both assigned to the same assignee of the present invention and incorporated herein by reference. Both of these patents describe circuitry for use in automatically aligning feedforward amplifiers, the latter using a pilot tone signal injected before the main amplifier to further aid in determining the IM distortion. However, feedforward circuits such as disclosed in these patents are not as advantageous for use with type 2 feedforward amplifiers (i.e., one in which the error amplifier handles some amount of the wanted signal power), because the carrier power detector is at the input or output of the error amplifier, and the carrier cancellation adjustment comes before the error (pilot) cancellation adjustment.

It would be highly advantageous therefore to provide a feedforward distortion minimization circuit that continuously, accurately and efficiently performs the gain and phase adjustments necessary to improve and maintain the intermodulation performance of a power amplifier, while avoiding unwanted interactions between cancellation adjustments and while minimizing power wasted in a dump load following the output combiner.

DETAILED DESCRIPTION OF THE EMBODIMENTS

Figure 3:
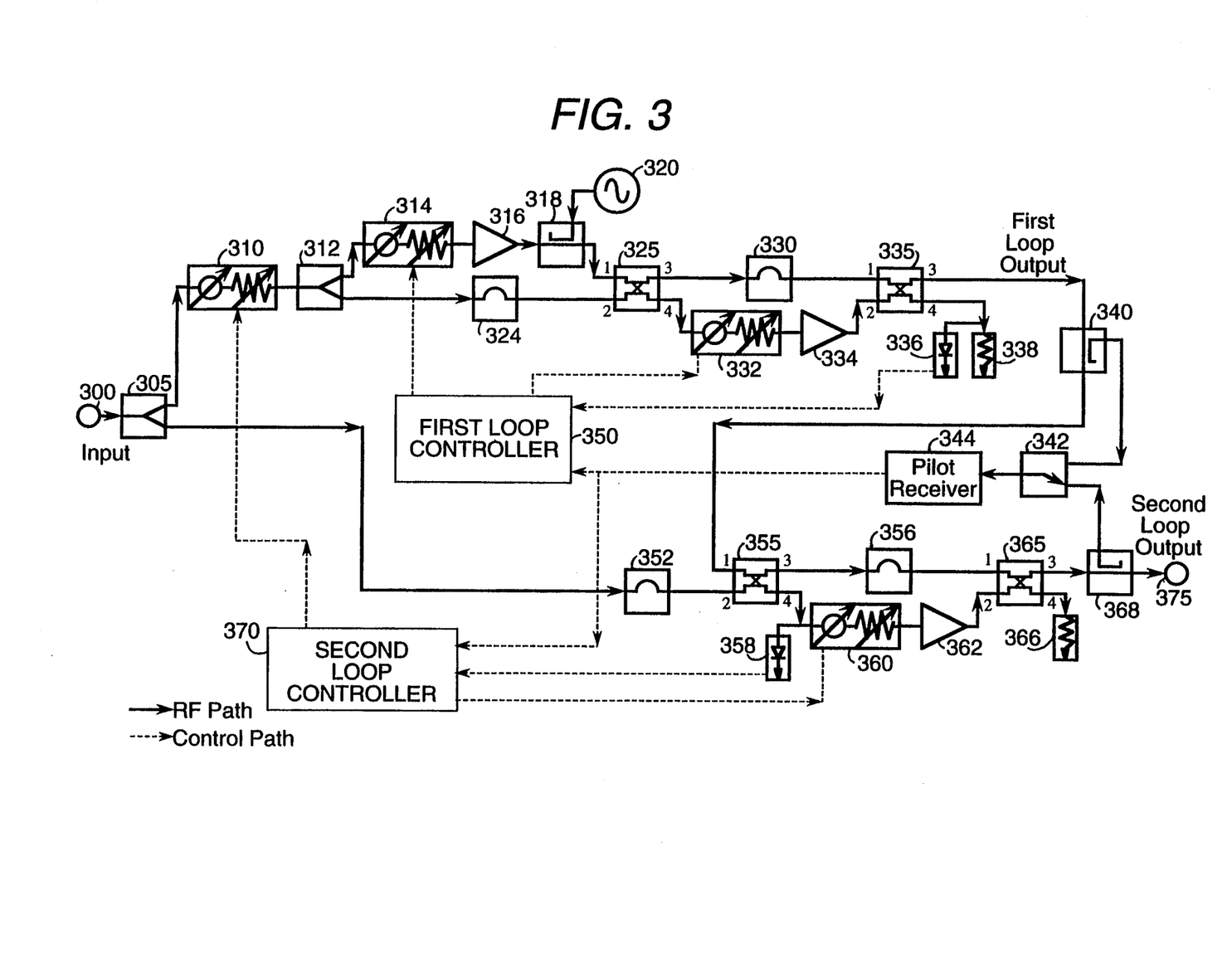
FIG. 3 is a block diagram illustrating a feedforward amplifier according to a first embodiment of the present invention.

These problems and others are met with a feedforward amplifier according to the present invention. FIG. 3 shows in block diagram a presently preferred embodiment of such a feedforward amplifier. Splitter circuit 305 provides input signal 300 to both loops of the feedforward amplifier. In the first loop, the input signal is gain and phase adjusted through gain/phase control 310, and further split via splitter 312 into two signal paths. The signal on the first main amplifier path from splitter 312 is gain and phase adjusted via gain/phase control 314, amplified by the first main amplifier 316, and then injected with a pilot tone from pilot tone source 320 via coupler 318. The other path is delayed via delay 324. Both paths are then joined at a first inter-loop coupler 325. A first output path (via port 3 of coupler 325) is delayed via delay 330, then fed into first output combiner 335. A second output path (via port 4) is gain and phase adjusted by gain/phase control 332 and amplified with amplifier 334, and then combined with the first path in combiner 335. Finally, a first output path (via port 3 of combiner 335) provides an output signal for the first loop. This first path is connected to the second loop, and is coupled to a pilot signal receiver 344 via a first loop output sampler 340 and switch 342. The second output path (via port 4 of combiner 335) leads to first carrier detector 336 and first dump load 338.

In the second loop, the output of splitter 305 is delayed via delay 352 and coupled with the output of the first loop via a second inter-loop coupler 355. A first output path of coupler 355 (via port 3) is delayed by delay 356. The second path (via port 4) is gain and phase adjusted via gain/phase control 360, and amplified by error amplifier 362. Both paths are combined at a second output combiner 365. The first output path from combiner 365 lead to the feedforward amplifier output 375, while the second path (via port 4) is shed via second dump load 366. The first output path of combiner 365 is also sampled via second loop output sampler 368, the sampled signal being operationally coupled to pilot receiver 344 via switch 342.

The gain/phase controllers 310, 314, 332, 360 are controlled by first and second loop controllers 350 and 370. First loop controller 350 receives for input the output from first carrier detector 336 and pilot receiver 344, and controls first and second gain/phase controls 314 and 332. Second loop controller 370 similarly receives for input the output from second carrier detector 358 and pilot receiver 344, and controls third and fourth gain/phase controls 310 and 360.

Two particular features found in the feedforward amplifier of FIG. 3 and not in any prior art ones are the location of the first carrier detector 336 and the type of amplifiers used in the first loop. Instead of locating the first carrier detector 336 across port 4 of the first inter-loop coupler 325, as one might expect from conventional system designs, detector 336 is connected across the first dump load 338. This advantageously causes the first loop to be aligned so as to maximize efficiency by minimizing power wasted in the first dump load 338. The other feature is that both amplifiers in the first loop may be of similar (approximately the same order of magnitude, often identical) power output capability, so both may deliver substantial carrier power to the system (first loop) output. As a consequence, the second amplifier in this loop is referred to as the "second main amplifier" rather than, as one would expect in conventional systems, the "first error amplifier".

One skilled in the art will appreciate the need to optimize both the sizing of the first and second main amplifiers 316, 334 and the couplers. In the case where the first and second main amplifiers 316, 334 are of equal size, and the loss in the delay line between the first inter-loop coupler 325 and the first output combiner 335 is not too high (say <1 dB), the first output combiner 335 may simply be a "−3 dB hybrid" combiner, i.e., a 2 way splitter hooked up in reverse. Where, on the other hand, the two main amplifiers 316, 334 have different peak output power capabilities, for optimum efficiency the first output combiner should be a "lossless" directional coupler (according to the principles laid down in H. Seidel, "A Microwave Feed-Forward Experiment," Bell System Technical Journal, Vol. 50, No. 9, pp. 2879–2916). Its coupling ratio should be chosen such that the difference between $|S32|$ and $|S31|$ (in dB) equals the difference between the peak output power capabilities of the first and second main amplifiers 316, 334 (expressed in dBm or dBW). If there is a substantial loss in the delay line 330 between the first inter-loop coupler 325 and the first output combiner 335, then this loss (in dB) should be subtracted from the output power capability of the first main amplifier 334 before determining the optimum coupling ratio for the first output combiner 335.

The main factor governing the relative power output capabilities of the two main amplifiers is the amount of IMD (intermodulation distortion) improvement needed in the first loop. When both main amplifiers 316, 334 are identical, then the first loop IMD is typically 6 dBc better than the IMD of the second main amplifier stage. This occurs because the feedforward loop between the two main amplifiers 316, 334, in principle, cancels all the IM spurs produced by the first main amplifier 316, so only IM spurs from the second main amplifier 334 appear in the first loop output. In addition, only half of the IM spur power from the second main amplifier 334 actually makes it to the first loop output, due to the low (e.g., −3 dB) coupling ratio in the first output combiner (the rest of the IM winds up in the first dump load 338). Finally, at the first loop output, the total carrier output power is twice that of the second main amplifier 334. Thus IMD, which is the ratio of the IM spur power to the carrier power, may be achieved which is 6 dB lower at the first loop output than it is at the output of the second main amplifier 334.

In the more general case where the two main amplifiers 316, 334 may have different power output capabilities, the IMD may be similarly shown to be lower at the first loop output than the IMD at the second main amplifier output by an amount equal to approximately twice the coupling ratio ($|S32|$ in dB) of the first output combiner 335. This relationship can be used to determine the relative "sizes" of these two amplifiers 316, 334, based on the amount of IMD improvement needed. By way of illustration, assume the case where a −30 dBc IMD level is required at the first loop output, but the second main amplifier 334 is only capable of −20 dBc IMD. In this case, the first loop needs to provide an IMD improvement of 10 dB, so the coupling ratio $|S32|$ for the first output combiner should be 5 dB. As one skilled in the art will understand, the corresponding value of $|S31|$ for this coupler is 2 dB, which is 3 dB less than $|S32|$, so the second main amplifier 334 should optimally have half the power output capability of the first main amplifier.

A skilled artisan will appreciate that there is a small penalty in efficiency associated with making the second main amplifier 334 smaller than the first, since this means that more of the first loop output power will be flowing through the lossy delay line 330 between the first inter-loop coupler 325 and the first output combiner 335. This is, however, a second order effect, compared to the efficiency improvement obtained by "canceling out" the carrier power wasted in the first dump load 338.

A similar set of considerations apply to the error amplifier 362 and the second output combiner 365. The coupling ratio for this combiner should be chosen such that the difference between $|S32|$ and $|S31|$ (in dB) equals the difference between the peak output power of the first loop and that of the error amplifier 362 (expressed in dBm or dBW). Again, if there is a substantial loss in the delay line 356 between the second inter-loop coupler 355 and the second output combiner 365, then this loss (in dB) should be subtracted from the output power capability of the first loop before determining the optimum coupling ratio for the second output combiner 365.

The procedure for determining the peak output power capability of the error amplifier 362 is somewhat different than the case for the second main amplifier 334 since the error amplifier 362 has to handle a substantial amount of IM spur power, in addition to any carrier power that is not canceled out in the second inter-loop coupler 355. The peak output power capability of the error amplifier should be high enough so that, after being attenuated by $|S32|$ of the second output combiner 365, it can still cancel the peak error signal (IM plus linearly distorted carriers) found at the output of the first loop. This means that ratio between the peak output power capabilities of the error amplifier and the first loop should be at least as high as half the IMD at the first loop output, or half the carrier cancellation level provided by the second inter-loop coupler 355, whichever is larger. By way of illustration again, assuming a first loop IMD of $-30$ dBc and peak output power of $+50$ dBm, then the peak output power capability of the error amplifier 362 must be at least $+35$ dBm ($-15$ dB relative to first loop power). In practice, a margin of around several dB is usually added to insure that an unfavorable summation of IM spurs and residual carriers does not drive the error amplifier 362 into clipping. In the above example, the error amplifier 362 would probably be designed to have a peak power capability of $+37$ to $+40$ dBm, with the corresponding coupling ratio ($|S32|$) for the second output combiner being 13 to 10 dB, respectively.

Optionally, it may be advantageous to use a Doherty-type amplifier for the first main amplifier 316 (and perhaps also for the second main amplifier 334). The principal benefit to be derived from this option is a much improved DC-RF power conversion efficiency. This occurs because the Doherty amplifier is typically about twice as efficient as a conventional Class AB linear amplifier when the signal to be amplified has a peak-to-average power ratio of 6 dB or more (which is typically the case for applications like multicarrier cellular linear power amplifiers (LPAs)). One drawback of the Doherty amplifier, however, is its poor wideband IMD performance compared to a Class AB amplifier. This drawback may be overcome within the system of FIG. 3 by using a "cleaner" (and probably smaller) Class AB second main amplifier 334.

Finally, because of the particular placement of the first carrier detector 336, the alignment procedures for properly setting up this system embodiment for minimum IMD differ from those used in a conventional two loop feedforward system. The preferred procedures will now be described, based on the assumption that the system is being powered up for the first time.

To begin with, the fourth gain/phase control 360 should be set for maximum attenuation (minimum gain) in order to effectively remove the error amplifier 362 from the system, thus allowing the first loop to be tuned up without interacting with the second loop, and also protecting the error amplifier 362 from overdrive. The remainder of the gain/phase controls 310, 314, 332 should then be set to midrange, the pilot tone source 320 should be activated, and a small amount of input power should be applied to the system (for example, 10–20 dB below nominal drive levels).

The first alignment step is to connect the pilot receiver 344 to the first loop output sampler 340 (via switch 342), and then adjust the second gain/phase control 332 so as to minimize the pilot signal detected by the pilot receiver 344. The second alignment step is to adjust the first gain/phase control 314 so as to minimize the amount of carrier power delivered to the first dump load 338, as measured by the first carrier detector 336. It should be noted that the order of these first two alignment steps is the opposite of what is used in a conventional two-loop feedforward amplifier. This is because the sub-loop containing the second main amplifier 334 must be properly balanced before attempting to do first loop carrier cancellation, which is now dependent on the alignment of that sub-loop.

The third alignment step is to adjust the third gain/phase control 310 to minimize the output of the second carrier detector 358. The fourth alignment step is to connect the pilot receiver 344 to the second loop output sampler 368, then adjust the fourth gain/phase control 360 so as to minimize the pilot signal detected by the pilot receiver 344. These last two steps are the same as in a conventional feedforward system.

Once the system has thus been pre-aligned at a low input power level, the input power can be raised by a modest amount (3 dB, for example) and the above alignment steps repeated. This process continues until the system reaches its nominal output power level. The alignment process may continue to run, even after the system has reached "full power", in order to compensate for thermal drift. In this case however, the step size of the amplitude and phase adjustments will normally be reduced to the minimum level, in order to minimize the effect of the ongoing alignment process on system performance.

The alignment process may also be allowed to run repetitively in multicarrier systems, such as cellular radio systems, where the output power may vary as a function of time due to power control and/or the activation and de-activation of individual carriers. Another alternative in this case would be to suspend (or slow down) the alignment process once convergence had been reached at a particular power level, but resume the full alignment procedure (until re-convergence) whenever there was a change in input/output power level.

Figure 4:
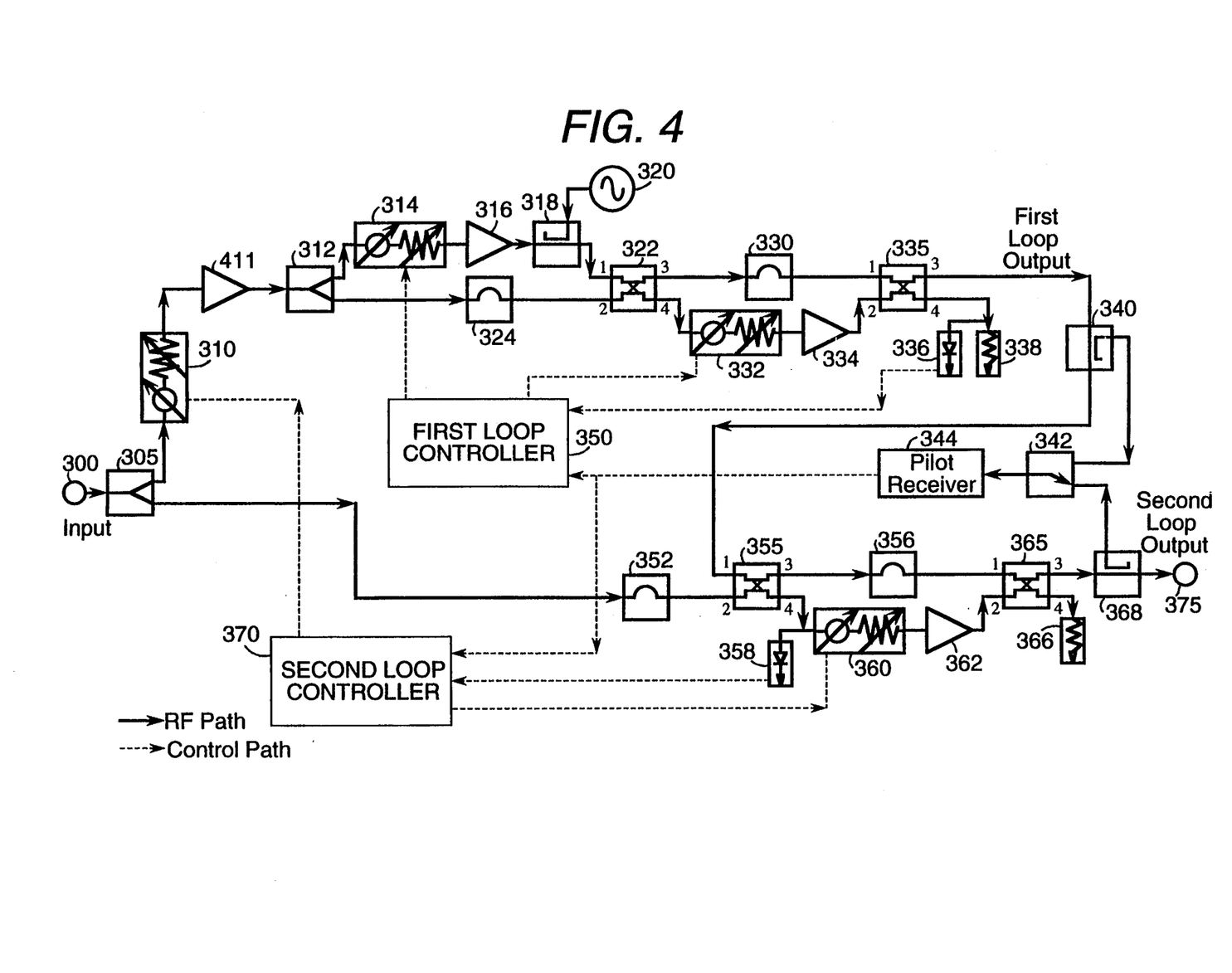
FIGS. 4 through 6 are block diagrams illustrating feedforward amplifiers according to three further embodiments of the present invention.

Turning now to FIG. 4, a first alternative embodiment of the invention will now be described. For convenience similar elements retain the same numbering as in FIG. 3. The principle difference in this embodiment from that of FIG. 3 can thus be seen to be the addition of a preamp 411 inside the second feedforward loop following gain/phase control 310. This arrangement enables the error amplifier 362 to cancel IM spurs generated in the preamp 411, in the same manner that it does for the main amplifiers 316, 334, so long ,as the preamp IMD is at least as good as the IMD at the first loop output.

Putting the preamp 411 inside the second feedforward loop allows it to be operated closer to its maximum output power capability, compared to the case where the preamp is outside both feedforward loops, since its IMD requirements are much less stringent when it is inside the second feedforward loop. Using the same assumptions as the above examples in connection with FIG. 3, the preamp IMD would have to be −65 dBc if it is outside both feedforward loops, but only −30 dBc if inside the second feedforward loop. Assuming that the preamp nonlinearities are predominantly third order, this 35 dB reduction in the IMD requirement translates to about a 17.5 dB decrease in preamp maximum output power, with a corresponding 17.5 dB decrease in preamp power consumption.

Putting the preamp 411 inside the second feedforward loop also avoids a hardware duplication problem associated with placing the preamp inside the first feedforward loop. This occurs because a duplicate preamp would have to be placed in front of the second main amplifier 334 in order to gain balance the first loop if a preamp is added ahead of the first main amplifier 316.

Figure 5:
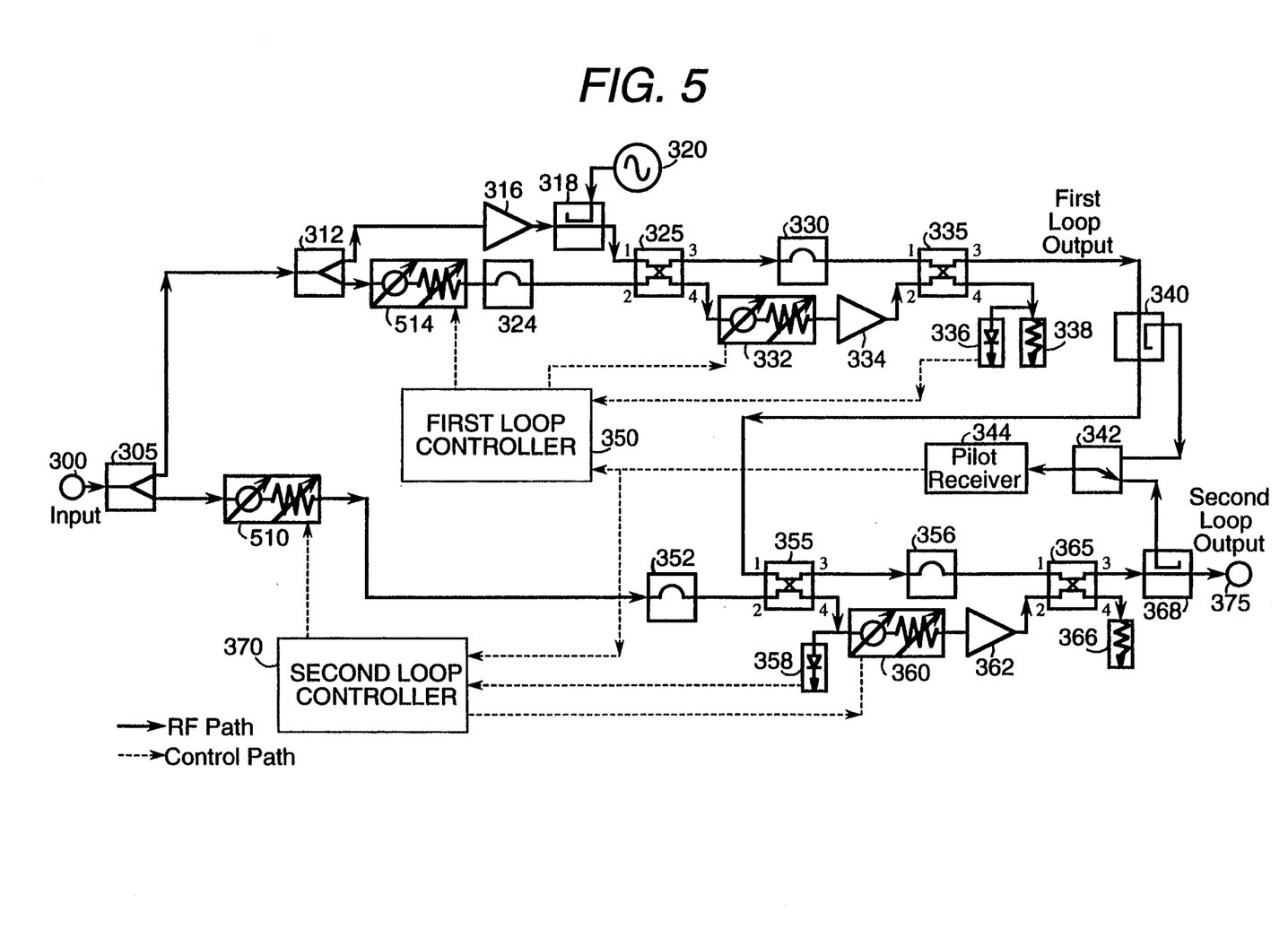
Figure 6:
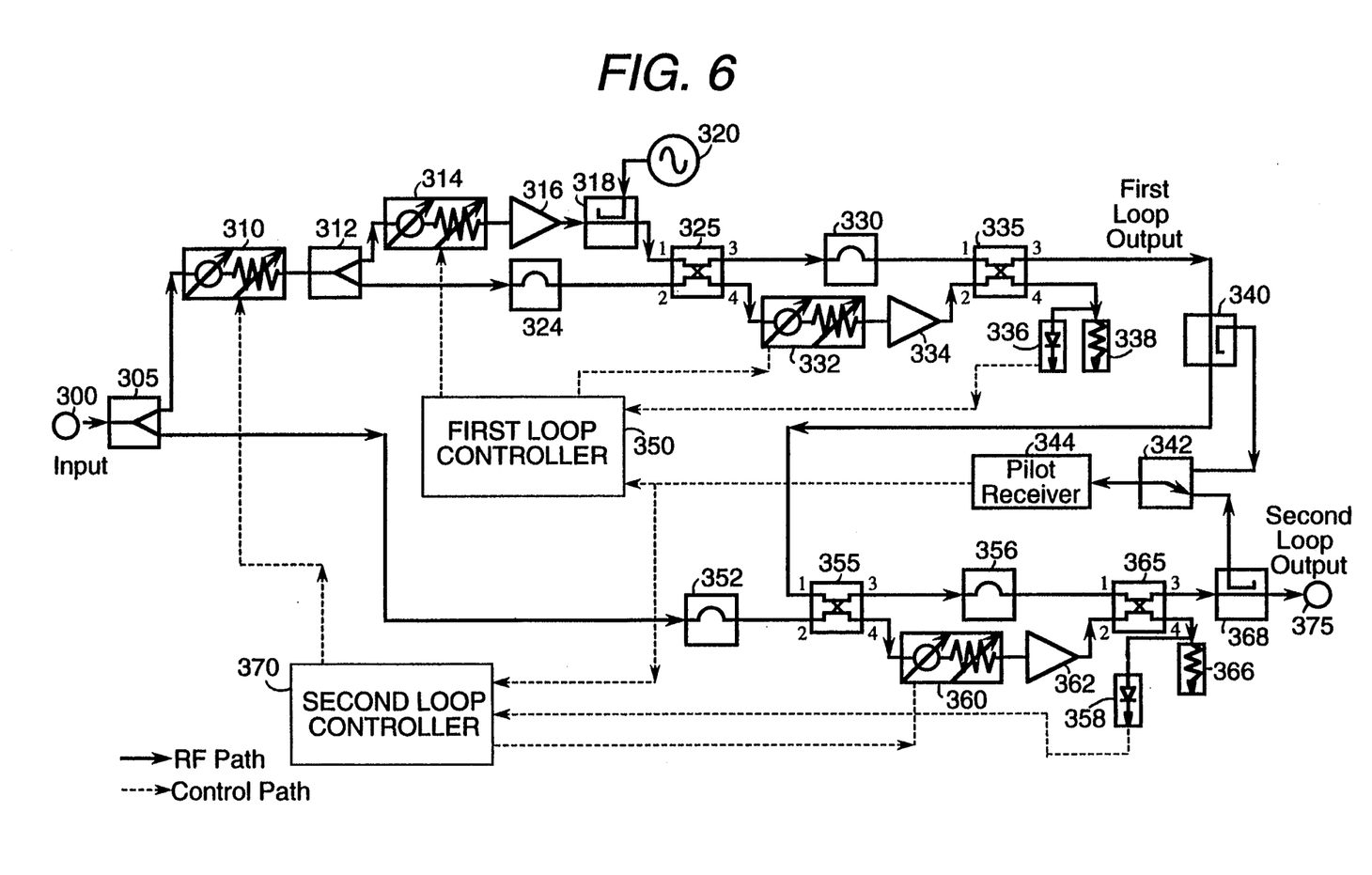

A further embodiment is illustrated in FIG. 5. In this embodiment the gain/phase controls 310, 314 of FIG. 3 are relocated to the positions of gain/phase controls 510, 514. Thus, the first and third gain/phase controls 514, 510 are placed in series with the delay lines 352, 324 in the "clean signal" path. This relocation of gain/phase controls is a typical design variation for a skilled artisan. Another common design variant is to split the inter-loop coupler into two parts, (each half being a three port coupler, like the output samplers), placing the carrier cancellation gain/phase control in the common line between the two couplers. It should be noted, however, that this latter approach makes the carrier cancellation adjustment interact with the error cancellation adjustment, which will make it very difficult to align the first loop in the "Type 2" feedforward systems described here. As one skilled in the art will appreciate, many other permutations can be derived by splitting the combined gain/phase control into separate gain and phase controls, then placing these in different parts of each sub-loop. A further variant, illustrated in FIG. 6, for example can be to move the second carrier detector 358 so it measures the power delivered to the second dump load 366, instead of the input power to the error amplifier 362. Since this makes the second loop function in much the same manner as the first loop, the third and fourth steps in the alignment procedure would then also need to be reversed. The error amplifier 362 should also have enough peak power output capability to supply both the power needed to cancel the IM spurs at the first loop output and its portion of the system's carrier output. In practice this would mean that the error amp carrier power requirement should first be determined as if it were a "third main amplifier", using a procedure similar to that used for the second main amplifier 334. The coupling ratio for the second output combiner 365 is also determined in this manner. Then the amount of peak power needed to cancel the IM spurs at the first loop would be calculated as before, but using the above determined output combiner coupling ratio. The total error amp peak power requirement would then be the sum of the above determined "carrier" and "IM" power levels.

The invention has thus been described with reference to illustrative embodiments thereof. It will be apparent to one skilled in the art that various modifications and changes can be made without departing from the spirit and the scope of the invention.

We claim:

1. A method of minimizing distortion produced by a power amplifier, comprising:
   (a) receiving an input signal;
   (b) providing a first loop having an input for receiving the input signal, a first signal path and a second signal path;
   (c) on the first signal path, generating a first amplified output signal having a distortion component by a first amplifier responsive to the input signal;
   (d) on the second signal path, generating a second amplified output signal having a distortion component by a second amplifier responsive to at least the input signal;
   (e) coupling the first and second signal paths via a first combiner so as to combine the first and second amplified output signals into a distortion corrected first loop output signal and a dump load signal; and
   (f) detecting the dump load signal and adjusting amplitude and phase of signals on at least one of the first and second signal paths in response to the detected dump load signal.

2. The method of claim 1 further comprising:
   (g) providing a second loop having an input for receiving the input signal and a third signal path;
   (h) combining the input signal with the distortion corrected first loop output signal and, on the third signal path, amplifying the combined signal so as to output a third amplified output signal; and
   (i) combining the distortion corrected first loop output signal and the third amplified output signal so as to output a distortion corrected second loop output signal.

3. The method of claim 2 further comprising:
   in step (c), further injecting a pilot tone into the first amplified output signal;
   in step (e), further sampling the distortion corrected first loop output signal for the pilot tone and further adjusting amplitude and phase of signals on at least one of the first and second signal paths in response to a detected pilot tone; and
   in step (i), further sampling the distortion corrected second loop output signal for the pilot tone and further adjusting amplitude and phase of signals on at least one of the first, second and third signal paths in response to a detected pilot tone.

4. The method of claim 3 further comprising aligning the first loop, wherein the first and second signal paths are coupled by a second combiner prior to the second amplifier, a first gain and phase control is coupled between the second combiner and the second amplifier, and a second gain and phase control is coupled after the first loop input on one of the first and second signal paths, and:
   adjusting the first gain and phase control so as to minimize the detected pilot tone signal; and
   next adjusting the second gain and phase control so as to minimize power of the detected dump load signal.

5. The method of claim 1 further comprising:
   in step (c), further injecting a pilot tone into the first amplified output signal; and
   in step (e), further sampling the distortion corrected first loop output signal for the pilot tone and further adjusting amplitude and phase of signals on at least one of the first and second signal paths in response to a detected pilot tone signal.

6. The method of claim 5 further comprising aligning the first loop, wherein the first and second signal paths are coupled by a second combiner prior to the second amplifier, a first gain and phase control is coupled between the second combiner and the second amplifier, and a second gain and phase control is coupled after the first loop input on one of the first and second signal paths, and:

adjusting the first gain and phase control so as to minimize the detected pilot tone signal; and next adjusting the second gain and phase control so as to minimize power of the detected dump load signal.

7. The method of claim 1, wherein the first and second signal paths are coupled by a second combiner prior to the second amplifier, a first gain and phase control is coupled between the second combiner and the second amplifier, and a second gain and phase control is coupled after the first loop input on one of the first and second signal paths, further comprising:

(g) in step (c), further injecting a pilot tone into the first amplified output signal;

(h) providing a second loop having a third signal path, a second input for receiving the input signal and being coupled via a third gain and phase control to the input of the first loop and to the third signal path, and a fourth signal path coupled to the first loop for receiving the distortion corrected first loop output signal;

(i) coupling the third and fourth signal paths via a third combiner so as to combine the input signal and distortion corrected first loop output signal into a first combined signal on the third signal path and a second combined signal on the fourth signal path;

(j) gain and phase correcting, via a fourth gain and phase control, and amplifying the first combined signal into a third amplified output signal;

(k) combining the second combined signal and the third amplified output signal so as to output a distortion corrected second loop output signal and a second dump load signal; detecting the first combined signal;

(m) aligning the first loop by sampling the distortion corrected first loop output signal for the pilot tone, adjusting the first gain and phase control so as to minimize a first sampled pilot tone signal, and then adjusting the second gain and phase control so as to minimize power of the detected dump load signal; and (n) aligning the second loop by adjusting the third gain and phase control so as to minimize power of the detected first combined signal, sampling the distortion corrected second loop output signal for the pilot tone, and then adjusting the fourth gain and phase control so as to minimize a second sampled pilot tone signal.

8. The method of claim 1, wherein the first and second signal paths are coupled by a second combiner prior to the second amplifier, a first gain and phase control is coupled between the second combiner and the second amplifier, and a second gain and phase control is coupled after the first loop input on one of the first and second signal paths, further comprising:

(g) in step (c), further injecting a pilot tone into the first amplified output signal;

(h) providing a second loop having a third signal path, a second input for receiving the input signal and being coupled via a third gain and phase control to the input of the first loop and to the third signal path, and a fourth signal path coupled to the first loop for receiving the distortion corrected first loop output signal;

(i) coupling the third and fourth signal paths via a third combiner so as to combine the input signal and distortion corrected first loop output signal into a first combined signal on the third signal path and a second combined signal on the fourth signal path;

(j) gain and phase correcting, via a fourth gain and phase control, and amplifying the first combined signal into a third amplified output signal;

(k) combining the second combined signal and the third amplified output signal so as to output a distortion corrected second loop output signal and a second dump load signal;

(l) detecting the second dump load signal;

(m) aligning the first loop by sampling the distortion corrected first loop output signal for the pilot tone, adjusting the first gain and phase control so as to minimize a first sampled pilot tone signal, and then adjusting the second gain and phase control so as to minimize power of the detected dump load signal; and (n) aligning the second loop by adjusting the third gain and phase control so as to minimize power of the detected second dump load signal, sampling the distortion corrected second loop output signal for the pilot tone, and then adjusting the fourth gain and phase control so as to minimize a second sampled pilot tone signal.

9. A method of linearly amplifying a signal, comprising:

(a) receiving an input signal;

(b) providing a first loop having an input for receiving the input signal, a first signal path and a second signal path;

(c) on the first signal path, generating a first amplified output signal having a first amplitude and a distortion component by a first amplifier responsive to the input signal;

(d) on the second signal path, generating a second amplified output signal having a second amplitude of approximately the same order of magnitude as the first amplitude and a distortion component by a second amplifier responsive to at least the input signal;

(e) coupling the first and second signal paths via a combiner so as to combine the first and second amplified output signals and output a distortion corrected first loop output and a dump load signal; and (f) detecting at the combiner the dump load signal and adjusting amplitude and phase of signals on at least one of the first and second signal paths in response to the detected dump load signal.

10. The method of claim 9 (d) further comprises generating the second amplified output signal by the second amplifier with a power factor substantially equivalent to a power factor of the first amplifier.

11. The method of claim 9 further comprising:

in step (c), further injecting a pilot tone into the first amplified output signal; and in step (e), further sampling the distortion corrected first loop output signal for the pilot tone and further adjusting amplitude and phase of signals on at least one of the first and second signal paths in response to a detected pilot tone signal.

12. The method of claim 11 further comprising aligning the first loop, wherein the first and second signal paths are coupled by a second combiner prior to the second amplifier, a first gain and phase control is coupled between the second combiner and the second amplifier, and a second gain and phase control is coupled after the first loop input on one of the first and second signal paths, and:

adjusting the first gain and phase control so as to minimize the detected pilot tone signal; and next adjusting the second gain and phase control so as to minimize power of the detected dump load signal.

13. The method of claim 9 further comprising:

(g) providing a second loop having an input for receiving the input signal and a third signal path;

(h) combining the input signal with the distortion corrected first loop output signal and, on the third signal path, amplifying the combined signal so as to output a third amplified output signal; and (i) combining the distortion corrected first loop output signal and the third amplified output signal so as to output a distortion corrected second loop output signal.

14. The method of claim 13 further comprising:

in step (c), further injecting a pilot tone into the first amplified output signal;

in step (e), further sampling the distortion corrected first loop output signal for the pilot tone and further adjusting amplitude and phase of signals on at least one of the first and second signal paths in response to a detected pilot tone; and in step (i), further sampling the distortion corrected second loop output signal for the pilot tone and further adjusting amplitude and phase of signals on at least one of the first, second and third signal paths in response to a detected pilot tone.

15. A method of aligning a first loop of a linear amplifier, the first loop having a first loop input for receiving an input signal, first and second signal paths having first and second amplifiers, respectively, and a first combiner coupling the first and second signal paths, after the first and second amplifiers, so as to output a distortion corrected first loop output signal, comprising:

(a) providing a second combiner coupling the first and second signal paths prior to the second amplifier, a first gain and phase control coupled between the second combiner and the second amplifier, and a second gain and phase control coupled after the first loop input on one of the first and second signal paths;

(b) receiving an input signal at the first loop input;

(c) on the first signal path, generating a first amplified output signal having a first amplitude and a distortion component by the first amplifier responsive to the input signal, and injecting a pilot tone;

(d) on the second signal path, generating a second amplified output signal having a second amplitude of approximately the same order of magnitude as the first amplitude and a distortion component by the second amplifier responsive to at least the input signal;

(e) detecting the distortion corrected first loop output, including a pilot tone component from the injected pilot tone signal;

(f) adjusting the first gain and phase control so as to minimize the detected pilot tone component; and (g) next adjusting the second gain and phase control so as to maximize power of the detected distortion corrected first loop output.

16. A method of minimizing distortion produced by a power amplifier having a first loop, the first loop having first and second signal paths each having an amplifier and an output combiner coupling the first and second signal paths, the output combiner having an output signal path and an output dump load path, the method comprising the steps of:

(a) providing a signal detector on the dump load path and detecting a dump load signal; and (b) adjusting gain and phase of a first signal on at least one of the first and second signal paths in response to the detected dump load signal.

17. The method of claim 16 further comprising:

(c) providing a second loop having an input for receiving a same input signal as for the first loop and a third signal path;

(d) combining the input signal with a distortion corrected first loop output signal on the output signal path and, on the third signal path, amplifying the combined signal so as to output a third amplified output signal; and (e) combining the distortion corrected first loop output signal and the third amplified output signal so as to output a distortion corrected second loop output signal.

18. The method of claim 16 further comprising:

(c) injecting a pilot tone into the first signal path; and (d) sampling a distortion corrected first loop output signal on the output signal path for the pilot tone and further adjusting amplitude and phase of signals on at least one of the first and second signal paths in response to a detected pilot tone signal.

19. The method of claim 18 further comprising aligning the first loop, wherein the first and second signal paths are coupled by a second combiner after the amplifier on the first signal path and prior to the amplifier on the second signal path, a first gain and phase control is coupled between the second combiner and the amplifier on the second signal path, and a second gain and phase control is coupled after a first loop input on one of the first and second signal paths, and wherein: in step (d), the step of adjusting comprises adjusting the first gain and phase control so as to minimize the detected pilot tone signal; and in step (b), the step of adjusting comprises adjusting, after the step of adjusting in step (d), the second gain and phase control so as to minimize power of the detected dump load signal.

20. A feedforward distortion minimization circuit comprising:

a first loop having a first input splitter and first and second signal paths from the output of the first splitter, each signal path having an amplifier;

an output combiner coupling the first and second signal paths, the output combiner having an output signal path and an output dump load path;

a first signal detector on the dump load path operable for detecting a dump load signal; and a gain and phase controller being operable for adjusting gain and phase of a first signal on at least one of the first and second signal paths in response to the detected dump load signal.

21. The circuit of claim 20 further comprising:
a pilot tone injector coupled to the first signal path;
a signal path coupler coupling the first signal path, after the pilot tone injector, and the second signal path, before the amplifier of the second signal path;
a first gain and phase control after the first input splitter and in one of the first signal path before the amplifier and the second signal path before the signal path coupler;
a second gain and phase control on the second signal path before the amplifier and after the signal path coupler; and
a pilot signal detector coupled to the output signal path operable for detecting an output pilot tone signal;
wherein the controller is coupled to an output of the pilot signal detector and further operable for adjusting one of the first and second gain and phase controls in response to at least one of the detected output pilot tone signal and the detected dump load signal.

22. The circuit of claim 20 further comprising:
a second input splitter having a first output path coupled to an input of the first input splitter;
a second loop having a third signal path coupled to a second output of the second input splitter, and a fourth signal path coupled to the output signal path of the first loop;
a coupler coupling the third and fourth signal paths;
a second output combiner coupling the third and fourth signal paths after the coupler and having a second loop output path and second dump load output path;
an error amplifier in the third signal path coupled between the coupler and second output combiner;
a first gain and phase control after the second input splitter and in one of the third signal path before the coupler and the first output path of the second input splitter before the first input splitter;
a second gain and phase control on the third signal path before the error amplifier and after the coupler;
a second signal detector coupled to one of the third signal path, before the second output combiner and after the coupler, and the second dump load output path; and
a further gain and phase controller having outputs coupled to the first and second gain and phase controls and being operable for adjusting gain and phase of a further signal on at least one of the third and fourth signal paths in response to an output of the second signal detector.

23. The circuit of claim 22 further comprising a preamplifier coupled between the second input splitter and an input to the first input splitter on the first output path.

24. The circuit of claim 22, further comprising:
a pilot tone injector coupled to the first signal path;
a second coupler coupling the first signal path, after the pilot tone injector, and the second signal path, before the amplifier of the second signal path;
a third gain and phase control after the first input splitter and in one of the first signal path before the amplifier and the second signal path before the signal path coupler;
a fourth gain and phase control on the second signal path before the amplifier and after the signal path coupler; and
a pilot signal detector coupled to the output signal path operable for detecting an output pilot tone signal;
wherein the controller is coupled to an output of the pilot signal detector and further operable for adjusting one of the third and fourth gain and phase controls in response to at least one of third detected output pilot tone signal and the detected dump load signal, and wherein the further gain and phase controller is coupled to the output of the pilot signal detector and further operable for adjusting one of the first and second gain and phase controls in response to at least one of the detected output pilot tone signal and the detected further signal.

25. The circuit of claim 22 wherein the first gain and phase control is in the first output path of the second input splitter before the first input splitter, further comprising a preamplifier coupled in one of the first output path between the first input splitter and the first gain and phase control, and the first output path between the second input splitter and the first gain and phase control.

26. A feedforward power amplifier having a first loop, the first loop having first and second signal paths each having an amplifier, comprising:
an output combiner means for coupling the signal paths, having an output signal path and an output dump load path;
signal detector means, on the dump load path, for detecting a dump load signal; and
control means for adjusting gain and phase of a first signal on at least one of the signal paths in response to the detected dump load signal.

27. The apparatus of claim 26 further comprising:
a second loop having an input means for receiving a same input signal as for the first loop, and a third signal path;
coupling means for combining the input signal with a distortion corrected first loop output signal on the output signal path, and amplifying means on the third signal path for amplifying the combined signal so as to output a third amplified output signal; and
second combining means for coupling the distortion corrected first loop output signal and the third amplified output signal so as to output a distortion corrected second loop output signal.

28. The apparatus of claim 26 further comprising:
pilot tone means for injecting a pilot tone into the first signal path; and
sampling means for sampling a distortion corrected first loop output signal on the output signal path for the pilot tone, and providing a detected pilot output to the control means, wherein the control means is further operable for adjusting amplitude and phase of a further signal on at least one of the first and second signal paths in response to a detected pilot tone signal.

29. The apparatus of claim 28 further comprising:
a second combiner means, after the amplifier on the first signal path and prior to the amplifier on the second signal path, for coupling the first and second signal paths;

a first gain and phase control coupled between the second combiner means and the amplifier on the second signal path; and a second gain and phase control coupled after a first loop input on one of the first and second signal paths;

wherein the control means is further operable for aligning the feedforward power amplifier by adjusting the first gain and phase control so as to minimize the detected pilot tone signal, and then adjusting the second gain and phase control so as to minimize power of the detected dump load signal.

* * * * *

UNITED STATES PATENT AND TRADEMARK OFFICE
CERTIFICATE OF CORRECTION

PATENT NO. : 5,444,418

DATED : August 22, 1995

INVENTOR(S) : James E. Mitzlaff

It is certified that error appears in the above-identified patent and that said Letters Patent is hereby corrected as shown below:

Column 9, Line 44 reads "(k) ... signal; detecting the first combined signal;"--should read "(k) ... signal; (l) detecting the first combined signal;"

Signed and Sealed this

Sixteenth Day of April, 1996

Attest:

BRUCE LEHMAN

Attesting Officer

Commissioner of Patents and Trademarks